United States Patent
Nakanishi

(10) Patent No.: US 7,475,375 B2
(45) Date of Patent: Jan. 6, 2009

(54) LAYOUT STRUCTURE ALLOWING INDEPENDENT SUPPLY OF SUBSTRATE/POWER SUPPLY POTENTIAL OF STANDARD CELL

(75) Inventor: Kazuyuki Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 285 days.

(21) Appl. No.: 11/354,936

(22) Filed: Feb. 16, 2006

(65) Prior Publication Data

US 2006/0181309 A1 Aug. 17, 2006

(30) Foreign Application Priority Data

Feb. 17, 2005 (JP) ............... 2005-040638

(51) Int. Cl.
*G06F 17/50* (2006.01)
(52) U.S. Cl. .................... 716/10; 716/8; 716/9
(58) Field of Classification Search .......... 716/8–10; 326/44
See application file for complete search history.

(56) References Cited

U.S. PATENT DOCUMENTS

| | | | | |
|---|---|---|---|---|
| 5,742,099 A | * | 4/1998 | Debnath et al. | 257/758 |
| 5,814,846 A | * | 9/1998 | Essbaum et al. | 257/207 |
| 6,091,090 A | * | 7/2000 | Gheewala | 257/211 |
| 6,759,698 B2 | | 7/2004 | Tanaka | |
| 6,912,703 B2 | * | 6/2005 | Wang et al. | 716/8 |
| 7,039,881 B2 | * | 5/2006 | Regan | 716/3 |
| 7,078,936 B2 | * | 7/2006 | Catalasan et al. | 326/102 |

FOREIGN PATENT DOCUMENTS

| | | |
|---|---|---|
| JP | 2001-230376 | 8/2001 |
| JP | 2003-309178 | 10/2003 |

\* cited by examiner

*Primary Examiner*—Vuthe Siek
(74) *Attorney, Agent, or Firm*—McDermott Will & Emery LLP

(57) ABSTRACT

A rectangular opening is formed in a power supply line which is shared between cell rows. A connection to a substrate potential supply line is ensured in the rectangular opening. Specifically, a semiconductor device includes a plurality of cell rows each including a plurality of standard cells arranged therein, a first power supply line for supplying a first potential to each of the standard cells, and a second power supply line for supplying a second potential to each of the standard cells, the second power supply line being electrically separated from the first power supply line. At least two standard cells share the first power supply line through a first interconnect provided in an interconnect layer and share the second power supply line through a second interconnect provided in the interconnect layer.

14 Claims, 19 Drawing Sheets

LAYOUT STRUCTURE ALLOWING INDEPENDENT SUPPLY OF SUBSTRATE/POWER SUPPLY POTENTIAL OF STANDARD CELL

BACKGROUND OF THE INVENTION

The present invention relates to a semiconductor device designed using a standard cell methodology, and more particularly relates to a layout structure which allows independent supply of a substrate potential and a power supply potential of a standard cell and a design method therefor.

With increase in the degree of integration and size of LSIs (semiconductor integrated circuits), which are a kind of semiconductor device, a standard cell methodology has been generally used as a design method for LSIs. Meanwhile, performance demands for LSIs have been increased and, furthermore, reduction in power consumption has been strongly required.

As a technique for reducing power consumption in an LSI employing a CMOSFET (complementary metal-oxide-semiconductor field-effect transistor), there has been a known technique in which a substrate potential of a MOSFET is controlled separately from a power source potential of the MOSFET to change a threshold voltage, thereby reducing an off leakage current of the MOSFET according to an operation state of the LSI. To use this technique, it is necessary that a substrate potential and a power supply potential of a MOSFET can be set to be different values, respectively. That is, the LSI has to have a layout structure in which a substrate potential supply source and a power supply potential supply source have to be separately located.

To implement the layout structure including a substrate potential supply line and a power supply potential supply line separately provided in an LSI designed by using a standard cell methodology, a layout structure including cells and cell rows arranged in the following manner has to be formed. A substrate potential supply line and a power supply potential supply line are formed so as to be electrically separated in a lower interconnect layer in each standard cell, using some means, substrate potential supply lines of a plurality of standard cells are connected to one another and power supply potential supply lines of the plurality of standard cells are connected to one another, and then the substrate potential supply lines and the power supply potential supply lines are connected to main power supply lines from an upper layer with the substrate potential supply lines electrically separated from the power supply potential supply lines (hereinafter, this layout structure will be called strap interconnection).

Hereinafter, two examples of known techniques for separating a substrate potential supply source and a power supply potential supply source will be described.

<<First Known Technique>>

FIG. 29 is a plan view of a standard cell 300 in a semiconductor device according to a first known technique. FIG. 30 is a cross-sectional view taken along the line A-B shown in FIG. 29.

The standard cell 300 of FIG. 29 includes a p-type MOSFET formation region 111 and an n-type MOSFET formation region 211. In the p-type MOSFET formation region 111, an impurity doped region 105 of a p-type MOSFET is connected to a first metal interconnect 107 through a contact hole 106. The first metal interconnect 107 supplies a high level power supply potential (VDD) to the impurity doped region 105 of the p-type MOSFET. In the n-type MOSFET formation region 211, an impurity doped region 205 of the n-type MOSFET is connected to a first metal interconnect 207 (in the same layer as the first metal interconnect 107) through a contact hole 206. The first metal interconnect 207 supplies a low level power supply potential (VSS) to the impurity doped region 205 of the n-type MOSFET. The reference numeral 303 denotes a polysilicon interconnect for formation and connection of gate electrodes of the MOSFETS.

At the outside of the first metal interconnect 107 of the p-type MOSFET formation region 111, an impurity doped interconnect 100 is connected to a first metal interconnect 102 (in the same layer as the first metal interconnect 107) through a contact hole 101. The first metal interconnect 102 receives a supply of a high level substrate potential (VDDBB: back bias) electrically separated from VDD. That is, the impurity doped region interconnect 100, the contact hole 101 and the first metal interconnect 102 together form a substrate contact region 110 of the p-type MOSFET. At the outside of the first metal interconnect 207 of the n-type MOSFET formation region 211, an impurity doped interconnect 200 is connected to a first metal interconnect 202 (in the same layer as the first metal interconnect 107) through a contact hole 201. The first metal interconnect 202 receives a supply of a low level substrate potential (VSSBB: back bias) electrically separated from VSS. That is, the impurity doped interconnect 200, the contact hole 201 and the first metal interconnect 202 together form a substrate contact region 210 of the n-type MOSFET.

FIG. 31 is a plan view illustrating known cell rows employing the standard cell 300 of FIG. 29. FIG. 31 illustrates a layout in which a plurality of standard cells 300 are arranged so as to extend in the left-right direction to form a single cell row and a plurality of cell rows are arranged in the top-down direction.

As shown in FIG. 31, each of the power supply potential supply lines 107 and 207 and the substrate potential supply lines 102 and 202 is formed around a cell boundary in a first metal interconnect layer so that a strap interconnection from main power supply lines (not shown) extending in the up-down direction can be achieved. Adjacent cell rows in the up-down direction share the substrate potential supply line 102 for receiving a supply of VDDBB. Japanese Laid-Open Publication No. 2001-230376 is an example of application of the known technique shown in FIG. 29 through FIG. 31.

<<Second Known Technique>>

FIG. 32 is a plan view illustrating a standard cell 300 and a substrate potential supply cell 301 in a semiconductor device according to a second known technique. FIG. 33 is a cross-sectional view taken along the line A-B shown in FIG. 32. FIG. 34 is a cross-sectional view taken along the line C-D shown in FIG. 32.

In the standard cell 300 of FIG. 32, a first metal interconnect 107 for receiving a supply of VDD extends to reach a cell boundary and an impurity doped interconnect 100 for receiving a supply of VDDBB is located under the first metal interconnect 107. In the same manner, a first metal interconnect 207 for receiving a supply of VSS substrate potential supply line extends to reach a cell boundary and an impurity doped interconnect 200 for receiving a supply of VSSBB is located under the first metal interconnect 207. In the substrate potential supply cell 301, the impurity doped interconnect 100 for receiving a supply of VDDBB is connected to a first metal interconnect 102 through a contact hole 101 and the impurity doped interconnect 200 for receiving a supply of VSSBB is connected to a first metal interconnect 202 through a contact hole 201.

FIG. 35 is a plan view illustrating cell rows employing the standard cell 300 and substrate potential supply cell 301 of FIG. 32. Through a strap interconnection (not shown), VDD, VSS, VDDBB and VSSBB are supplied from main power supply lines (not shown) to the first metal interconnects 107, 207, 102 and 202, respectively. Adjacent cell rows in the up-down direction share the power supply potential supply line 107 for receiving a supply of VDD. Japanese Laid-Open Publication No. 2003-309178 is an example of application of the known technique shown in FIGS. 32 through 35.

In the first known technique, a large interconnect region is required because adjacent cell rows in the up-down direction can share the substrate potential supply line 102 but not the power supply potential supply line 107. As a result, interconnect resources for signal lines connecting the standard cells 300 are reduced and the area of an LSI is increased. In contrast, to reduce the area of an interconnect region, the width of the power supply potential supply line 107 has to be reduced, and the amount of a drop in power supply from main power supply lines to the standard cells 300 is increased. This results in reduction in operation speed of the LSI.

In the second known technique, the constraint that in addition to the standard cells 300, the substrate potential supply cells 301 has to be provided in advance in a predetermined location before providing the standard cells 300 arises, and thus the degree of design freedom in forming cell rows is reduced. Moreover, an empty region in which the standard cells 300 do not exist is generated in the vicinity of the substrate potential supply cells 301. That is, a wasted area is generated in the LSI.

SUMMARY OF THE INVENTION

The present invention has been devised to solve the above-described problems and it is therefore an object of the present invention to provide a standard cell layout structure for reduction in the area of a power supply interconnect region and the amount of a drop in power supply, a semiconductor device employing the standard cell structure and a design method for the layout structure.

To solve the above-described problems, a semiconductor device according to the present invention includes: a plurality of cell rows each including a plurality of standard cells arranged therein; a first power supply line for supplying a first potential to each of the standard cells; and a second power supply line for supplying a second potential to each of the standard cells, the second power supply line being electrically separated from the first power supply line, and is characterized in that in the semiconductor device, adjacent two of the standard cells in the cell rows or ones of the standard cells arranged in one of the cell rows share the first power supply line through a first interconnect provided in an interconnect layer and share the second power supply line through a second interconnect provided in the interconnect layer. In the semiconductor device, each of electrically separated two power supply lines can be shared between cell rows, so that a power supply interconnect region can be reduced.

DESCRIPTION OF THE PREFERRED EMBODIMENTS

Hereafter, first through tenth embodiments of the present invention will be described in detail with reference to FIGS. 1 through 28. In each of the following embodiments, description will be made with focus on supply of a high level power supply potential VDD and supply of a high level substrate potential VDDBB. Description regarding supply of a low level power supply potential VSS and a low level substrate potential VSSBB will be omitted as necessary.

First Embodiment

Figure 1:
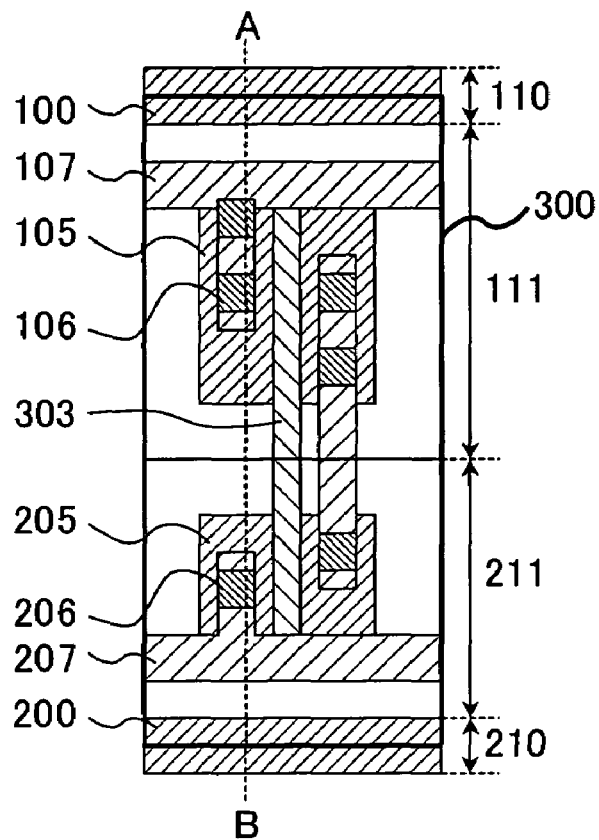
FIG. 1 is a plan view of a standard cell in a semiconductor device according to a first embodiment of the present invention.
Figure 2:
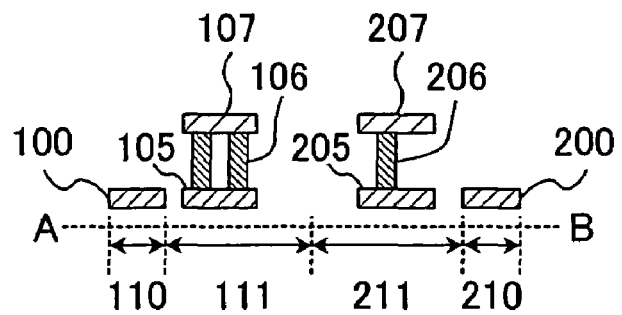
FIG. 2 is a cross-sectional view taken along the line A-B shown in FIG. 1.

FIG. 1 is a plan view of a standard cell 300 in a semiconductor device according to a first embodiment of the present invention. FIG. 2 is a cross-sectional view taken along the line A-B shown in FIG. 1.

The standard cell 300 of FIG. 1 includes a p-type MOSFET formation region 111 and an n-type MOSFET formation region 211. In the p-type MOSFET formation region 111, an impurity doped region 105 of a p-type MOSFET is connected to a first metal interconnect 107 through a contact hole 106. In the n-type MOSFET formation region 211, an impurity doped region 205 of an n-type MOSFET is connected to a first metal interconnect 207 (in the same layer as the first metal interconnect 107) through a contact hole 206. An impurity doped interconnect 100 is formed in a substrate contact region 110 located at the outside of the p-type MOSFET formation region 111 and an impurity doped interconnect 200 is formed in a substrate contact region 210 located at the outside of the n-type MOSFET formation region so that each of the impurity doped interconnects 100 and 200 extends in the left-right direction.

Figure 3:
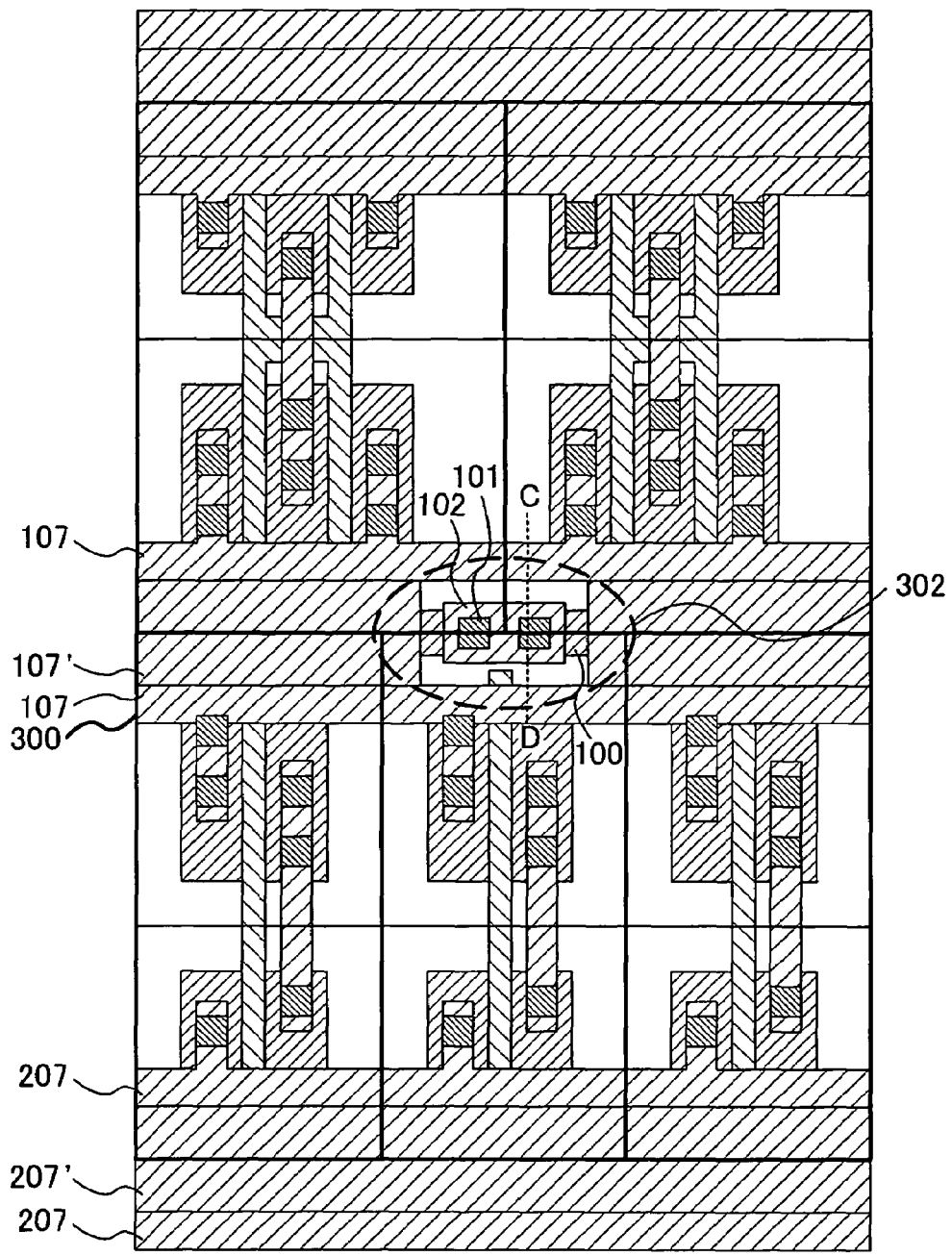
FIG. 3 is a plan view illustrating cell rows employing the standard cell of FIG. 1.
Figure 4:
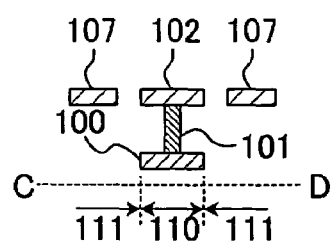
FIG. 4 is a cross-sectional view taken along the line C-D shown in FIG. 3.

FIG. 3 is a plan view illustrating cell rows employing the standard cell 300 of FIG. 1. FIG. 3 illustrates a layout in which a plurality of standard cells 300 of FIG. 1 are arranged so as to extend in the left-right direction to form a single cell row and a plurality of cell rows are arranged in the top-down direction. FIG. 4 is a cross-sectional view taken along the line C-D shown in FIG. 3.

As shown in FIG. 3, after formation of cell rows, a metal interconnect 107' (which is in contact with first metal interconnects 107 of adjacent cells in the up-down direction) for reinforcing the first metal interconnects 107 is formed in the same layer as the first metal interconnects 107 so as to be located on the impurity doped interconnect 100 located between adjacent cell rows. A rectangular opening is formed by the first metal interconnects 107 and 107'. The rectangular opening is for a substrate contact formation section 302. The first metal interconnects 107 and 107' receive a supply of VDD. In the substrate contact formation section 302, the impurity doped interconnect 100 is connected to a first metal interconnect 102 (in the same layer as the first metal interconnects 107) through a contact hole 101. The first metal interconnect 102 receives a supply of VDDBB electrically separated from VDD. The substrate contact formation section 302 is located right under a main power supply line (not shown) for supplying VDDBB. The main power supply line extends in the up-down direction. Moreover, a metal interconnect 207' (in the same layer as the first metal interconnects 107 and in contact with the first metal interconnects 207 of adjacent cells in the up-down direction) for reinforcing the first metal interconnects 207 is formed on the impurity doped interconnect 200 (see FIG. 1) located between adjacent cell rows in the up-down direction. The first metal interconnects 207 and 207' receive a supply of VSS. Description of means for receiving a supply of VSSBB electrically separated from VSS will be omitted.

As has been described, a power potential supply line which is formed of the first metal interconnects 107 and 107' and is reinforced has a larger width than that of the power potential supply line of the known technique, and a power supply interconnect region can be reduced. Thus, reduction in area and increase in operation speed of an LSI can be achieved. The interconnect width of the power supply potential supply line 107 is reduced in the vicinity of the substrate contact formation section 302. However, the number of substrate contact formation sections 302 per LSI is small, and adverse effects are not imposed on the amount of a voltage drop in power potential of the entire LSI.

Second Embodiment

Figure 5:
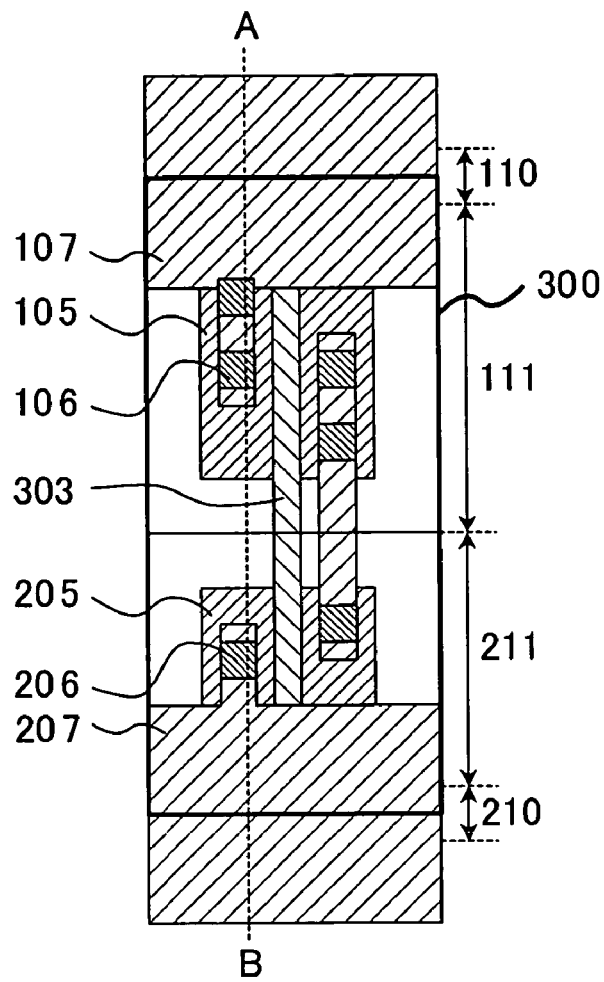
FIG. 5 is a plan view of a standard cell in a semiconductor device according to a second embodiment of the present invention.
Figure 6:
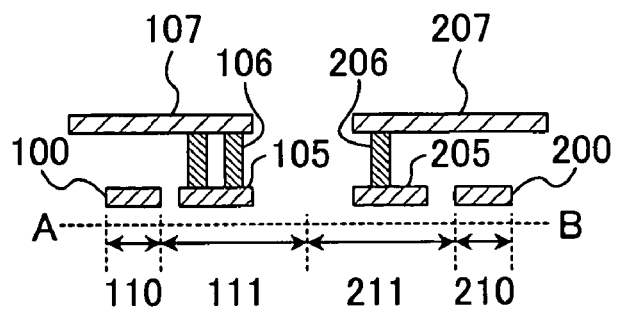
FIG. 6 is a cross-sectional view taken along the line A-B shown in FIG. 5.
Figure 7:
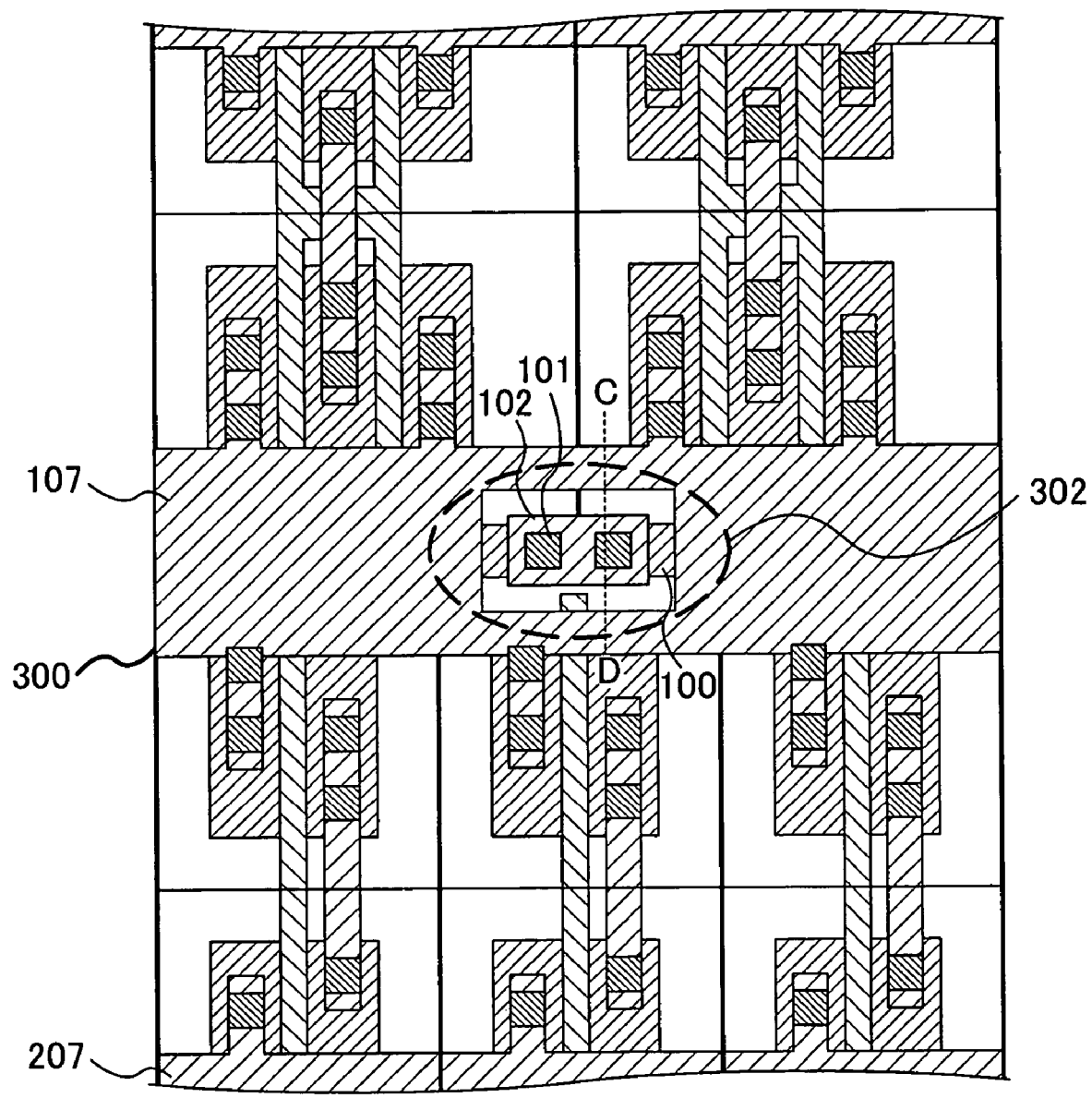
FIG. 7 is a plan view illustrating cell rows employing the standard cell of FIG. 5.

FIG. 5 is a plan view of a standard cell 300 in a semiconductor device according to a second embodiment of the present invention. FIG. 6 is a cross-sectional view taken along the line A-B shown in FIG. 5. FIG. 7 is a plan view illustrating cell rows employing the standard cell 300 of FIG. 5.

In this embodiment, unlike the first embodiment, in the standard cell 300 shown in FIGS. 5 and 6, a first metal interconnect 107 for receiving a supply of VDD extends to reach a cell boundary on an impurity doped interconnect 100 for receiving a supply of VDDBB. In the same manner, a first metal interconnect 207 for receiving a supply of VSS extends to reach a cell boundary on an impurity doped interconnect 200 for receiving a supply of VSSBB. According to this embodiment, the first metal interconnect 107 for receiving a supply of VDD is formed in advance so as to have a large area in the standard cell 300, and then, after formation of cell rows, part of the first metal interconnect 107 having an appropriate area is removed such that a substrate contact formation section 302 can be provided there (see FIG. 7). A cross section taken along the line C-D shown in FIG. 7 has the same view as FIG. 4.

Third Embodiment

Figure 8:
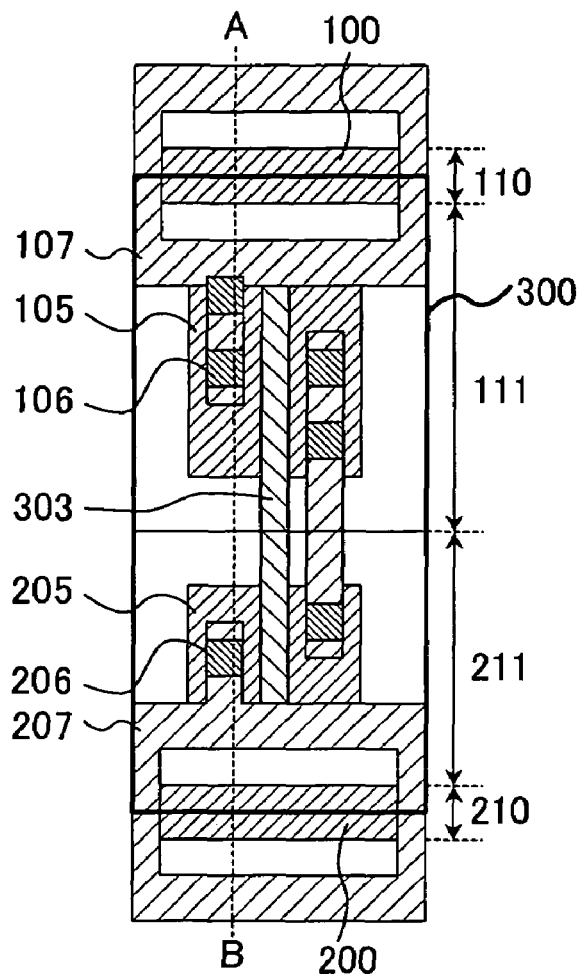
FIG. 8 is a plan view of a standard cell in a semiconductor device according to a third embodiment of the present invention.
Figure 9:
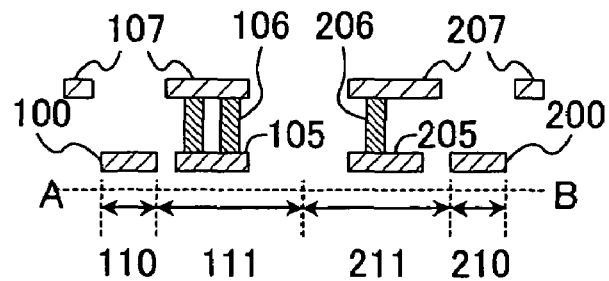
FIG. 9 is a cross-sectional view taken along the line A-B shown in FIG. 8.
Figure 10:
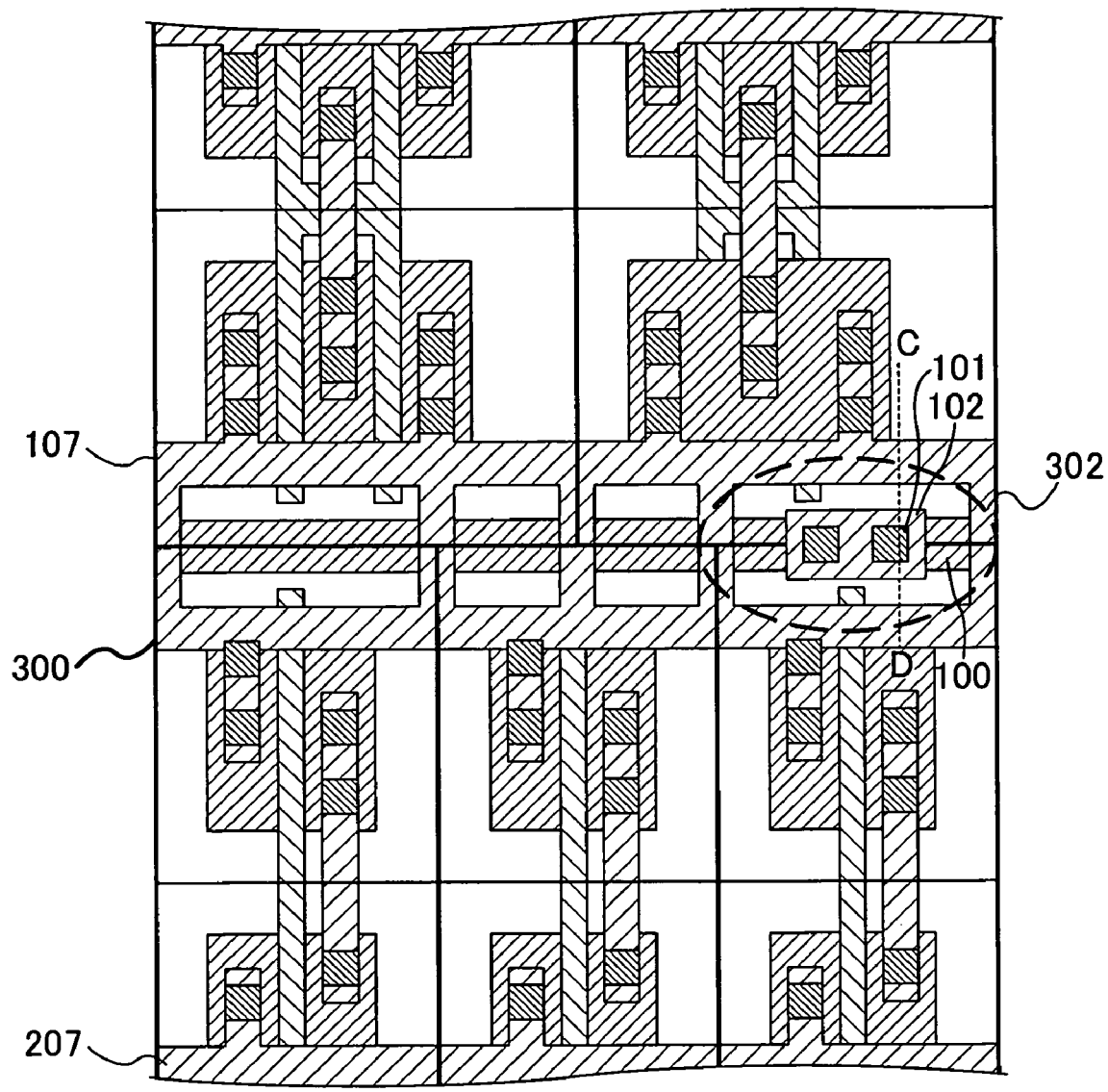
FIG. 10 is a plan view illustrating cell rows employing the standard cell of FIG. 8.

FIG. 8 is a plan view of a standard cell 300 in a semiconductor device according to a third embodiment of the present invention. FIG. 9 is a cross-sectional view taken along the line A-B shown in FIG. 8. FIG. 10 is a plan view illustrating cell rows employing the standard cell 300 of FIG. 8.

In this embodiment, unlike the second embodiment, in each standard cell 300 shown in FIGS. 5 and 6, a rectangular opening is formed in advance in a first metal interconnect 107 for receiving a supply of VDD. In the same manner, a rectangular opening is formed in advance in a first metal interconnect 207 for receiving a supply of VSS. Then, after formation of cell rows, a first metal interconnect 102 for receiving a supply of VDDBB is formed in an appropriate location (see FIG. 10). A cross section taken along the line C-D shown in FIG. 10 has the same view as FIG. 4.

Fourth Embodiment

Figure 11:
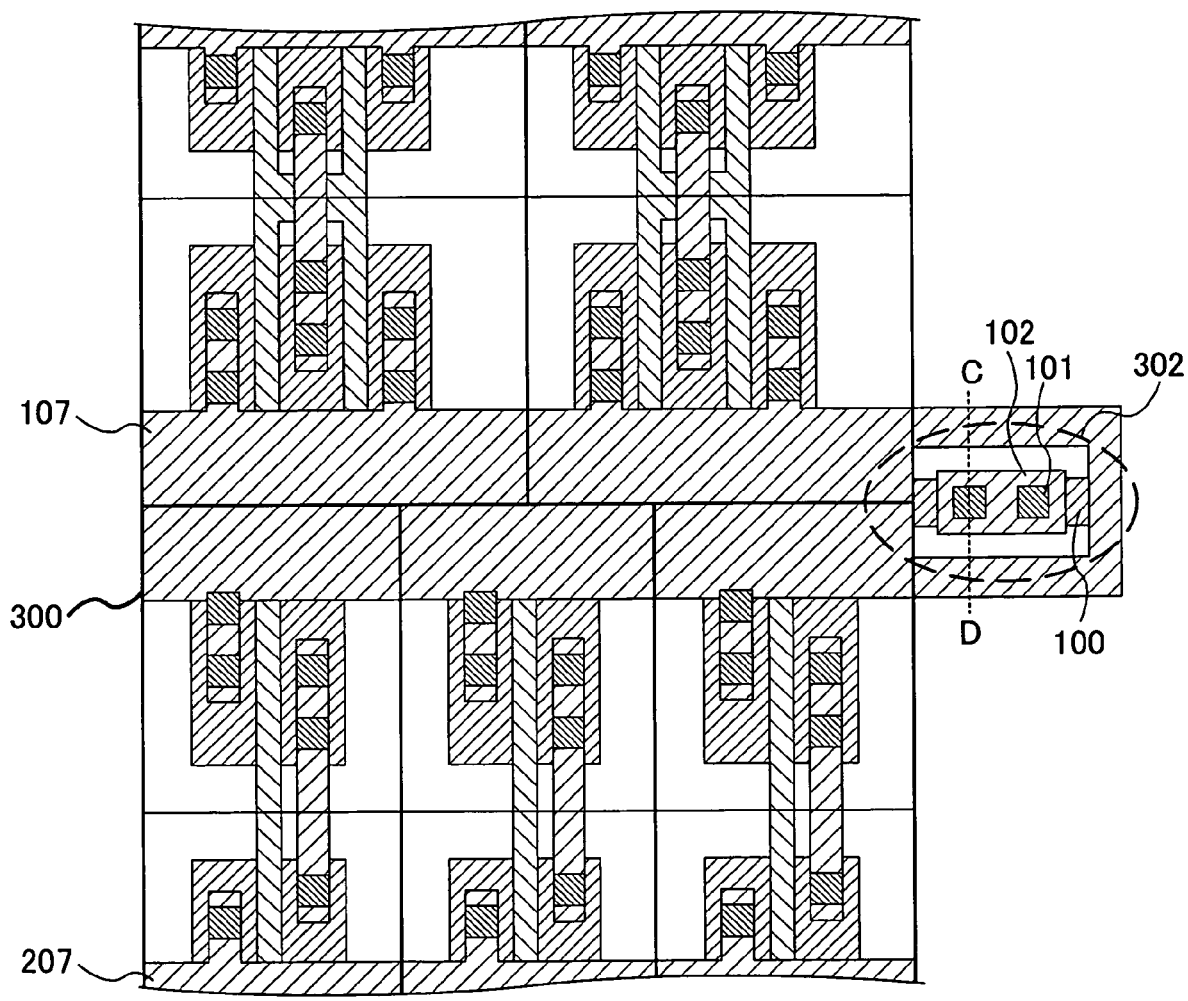
FIG. 11 is a plan view illustrating cell rows in a semiconductor device according to a fourth embodiment of the present invention.

FIG. 11 is a plan view illustrating cell rows in a semiconductor device according to a fourth embodiment of the present invention. In this embodiment, unlike the second embodiment, a substrate contact formation section 302 is formed on an extension of a cell row. A cross section taken along the line C-D shown in FIG. 11 has the same view as FIG. 4. According to the fourth embodiment, VDDBB can be supplied from a region in which a standard cell 300 is not disposed, so that the degree of design freedom of a strap interconnection can be improved.

Fifth Embodiment

Figure 12:
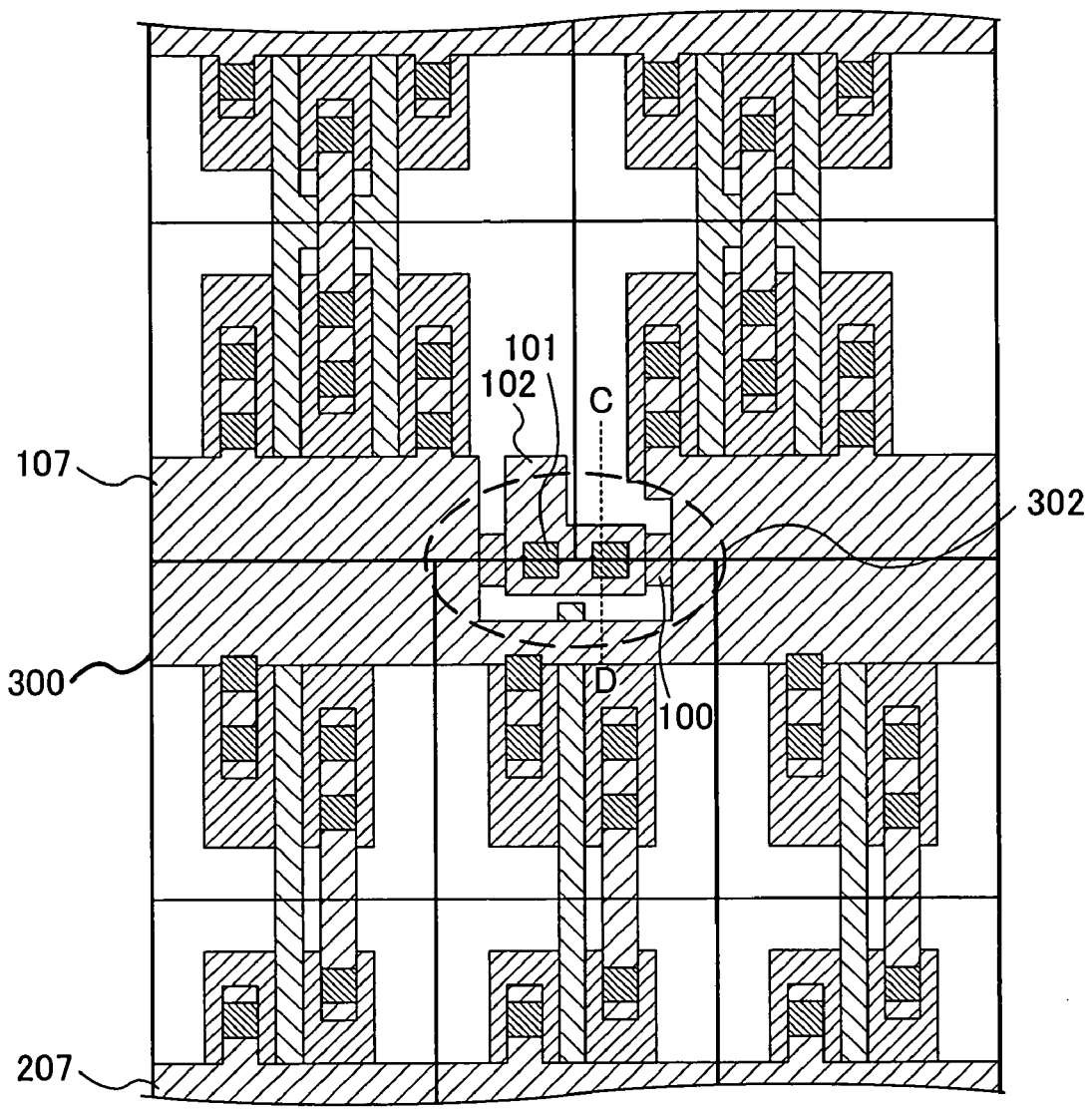
FIG. 12 is a plan view illustrating cell rows in a semiconductor device according to a fifth embodiment of the present invention.
Figure 13:
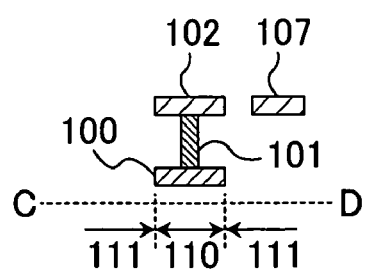
FIG. 13 is a cross-sectional view taken along the line C-D shown in FIG. 12.

FIG. 12 is a plan view illustrating cell rows in a semiconductor device according to a fifth embodiment of the present invention. FIG. 13 is a cross-sectional view taken along the line C-D shown in FIG. 12.

This embodiment is different from the second embodiment in that a substrate contact formation section 302 has a different shape. Specifically, a first metal interconnect 102 for receiving a supply of VDDBB is surrounded on not four but three sides by a first metal interconnect 107 for receiving a supply of VDD. Thus, the first metal interconnect 102 for receiving a supply of VDDBB becomes wider in the up-down direction, so that the degree of design freedom of a strap interconnection can be improved.

Sixth Embodiment

Figure 14:
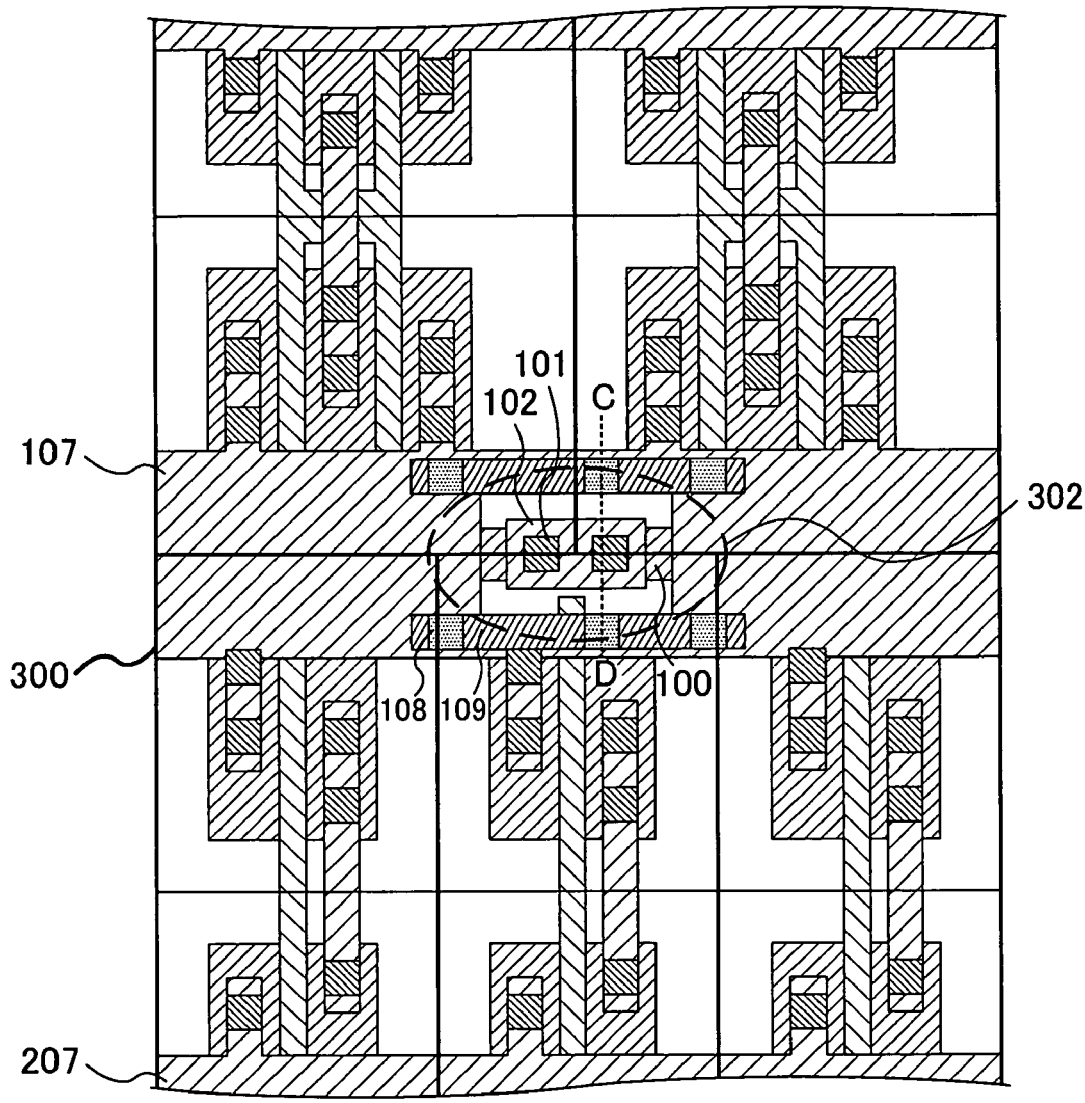
FIG. 14 is a plan view illustrating cell rows in a semiconductor device according to a sixth embodiment of the present invention.
Figure 15:
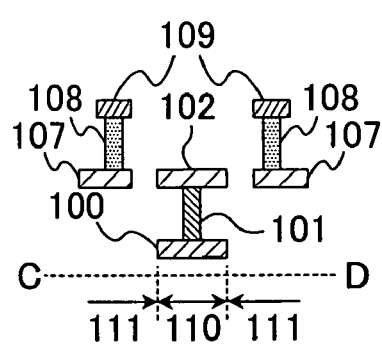
FIG. 15 is a cross-sectional view taken along the line C-D shown in FIG. 14.

FIG. 14 is a plan view illustrating cell rows in a semiconductor device according to a sixth embodiment of the present invention. FIG. 15 is a cross-sectional view taken along the line C-D shown in FIG. 14.

This embodiment is different from the second embodiment in that a first metal interconnect 107 is lined with narrow slips around a substrate contact formation section 302. Specifically, a second metal interconnect 109 is formed over narrow part of the first metal interconnect 107 for receiving a supply of VDD to be connected to the first metal interconnect 107 through a via hole 108. Thus, the amount of a voltage drop in a power supply potential supply line formed of the first metal interconnect 107 and the second metal interconnect 109 can be reduced even in the vicinity of the substrate contact formation section 302.

Seventh Embodiment

Figure 16:
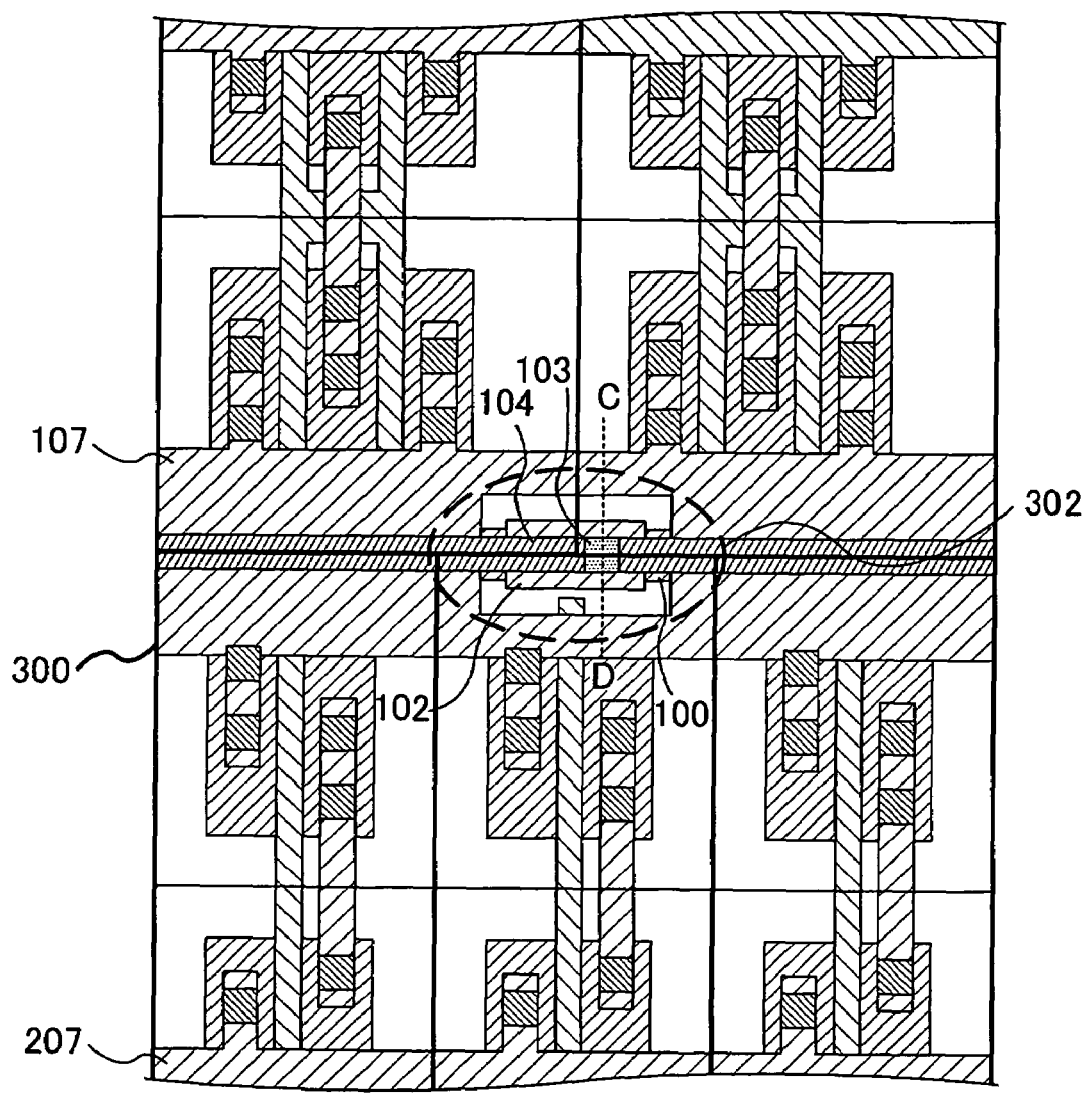
FIG. 16 is a plan view illustrating cell rows in a semiconductor device according to a seventh embodiment of the present invention.
Figure 17:
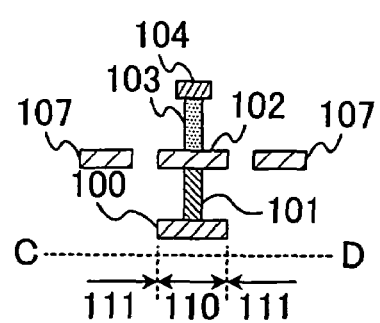
FIG. 17 is a cross-sectional view taken along the line C-D shown in FIG. 16.

FIG. 16 is a plan view illustrating cell rows in a semiconductor device according to a seventh embodiment of the present invention. FIG. 17 is a cross-sectional view taken along the line C-D shown in FIG. 16.

This embodiment is different from the second embodiment in that a first metal interconnect 102 for receiving a supply of VDDBB is lined. Specifically, a second metal interconnect 104 is formed over part of the first metal interconnect 102 located right under a main power supply line (not shown) to be connected to the first metal interconnect 102 through a via hole 103. The second interconnect 104 extends along an impurity doped interconnect 100 in the left-right direction. Thus, the amount of a voltage drop in a substrate potential supply line formed of the first metal interconnect 102 and the second metal interconnect 104 can be reduced.

Eighth Embodiment

Figure 18:
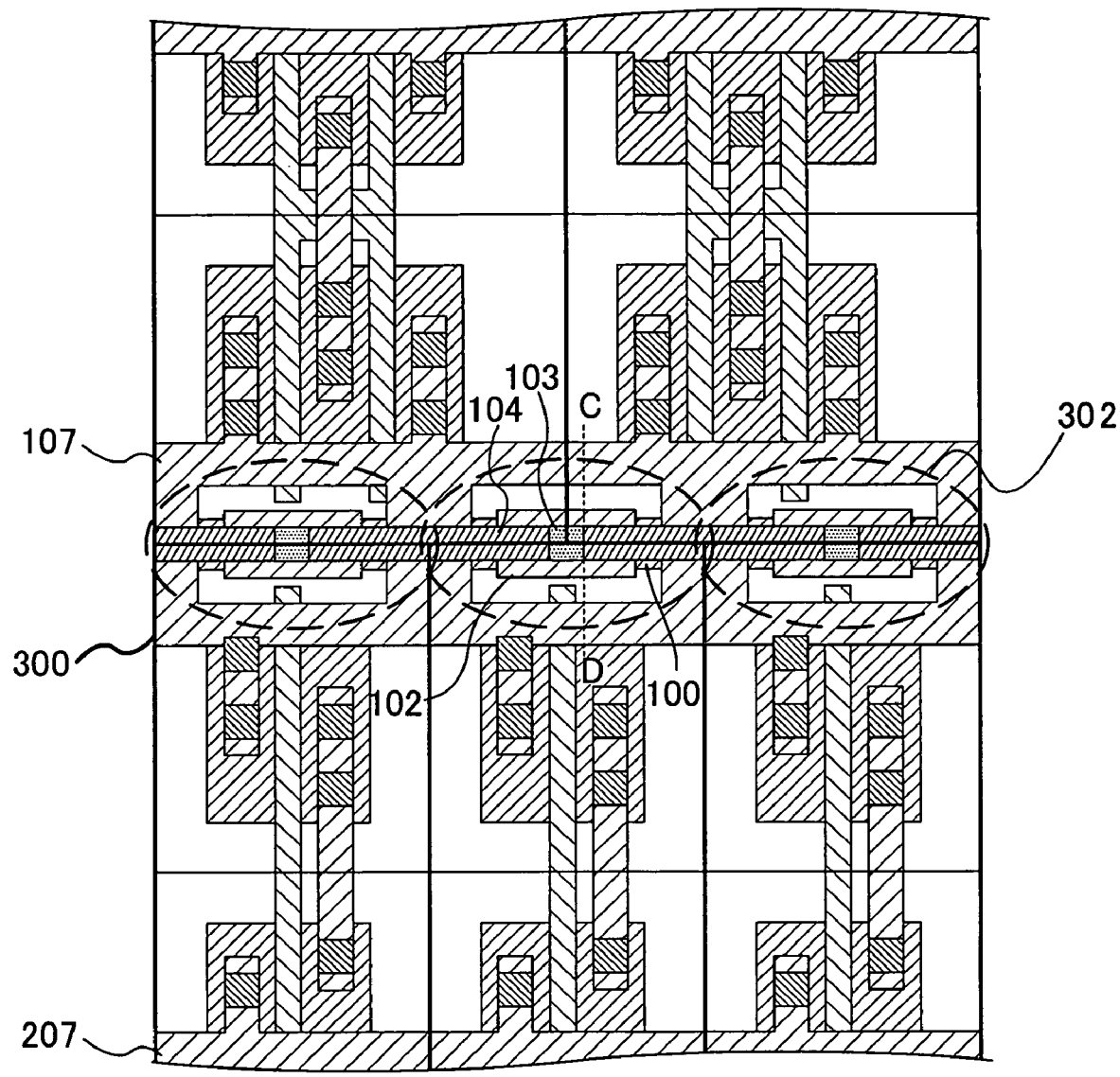
FIG. 18 is a plan view illustrating cell rows in a semiconductor device according to an eighth embodiment of the present invention.

FIG. 18 is a plan view illustrating cell rows in a semiconductor device according to an eighth embodiment of the present invention. A cross section taken along the line C-D shown in FIG. 18 has the same view as FIG. 17.

In this embodiment, unlike the seventh embodiment, substrate contact formation sections 302 are not only provided right under main power supply lines but also provided so as to extend along each cell row at regular intervals. Thus, the amount of a voltage drop in a substrate potential supply line formed of a first metal interconnect 102 and a second metal interconnect 104 can be reduced.

Ninth Embodiment

Figure 19:
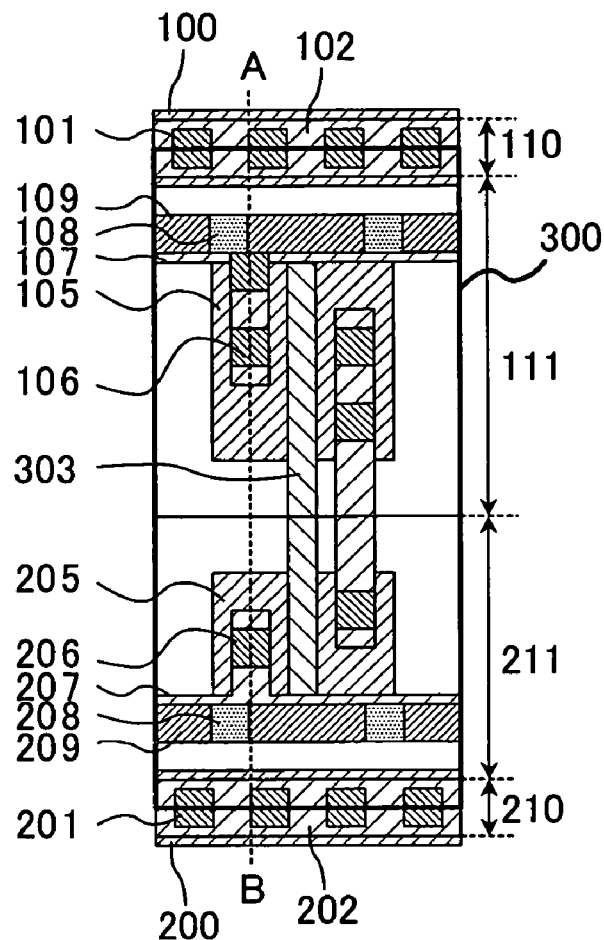
FIG. 19 is a plan view of a standard cell in a semiconductor device according to a ninth embodiment of the present invention.
Figure 20:
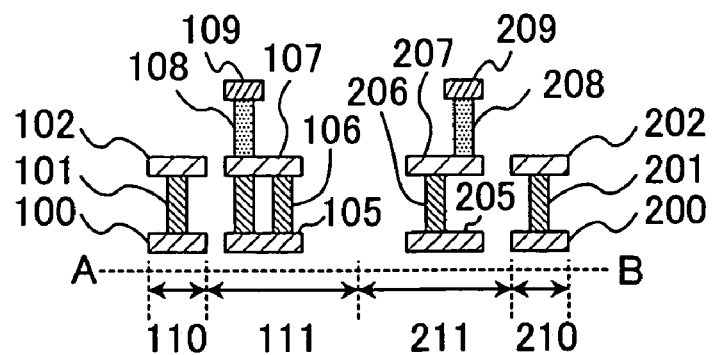
FIG. 20 is a cross-sectional view taken along the line A-B shown in FIG. 19.

FIG. 19 is a plan view of a standard cell 300 in a semiconductor device according to a ninth embodiment of the present invention. FIG. 20 is a cross-sectional view taken along the line A-B shown in FIG. 19.

In a p-type MOSFET formation region 111 shown in FIG. 19, an impurity doped region 105 of a p-type MOSFET is connected to a first metal interconnect 107 through a contact hole 106 and a second metal interconnect 109 is formed over the first metal interconnect 107 to be connected to the first metal interconnect 107 through a via hole 108, the first metal interconnect 107 and the second metal interconnect 109 extending in the left-right direction. In an n-type MOSFET formation region 211, an impurity doped region 205 of an n-type MOSFET is connected to a first metal interconnect 207 through a contact hole 206 and a second metal interconnect 209 is formed over the first metal interconnect 207 to be connected to the first metal interconnect 207 through a via hole 208, the first metal interconnect 207 and the second metal interconnect 209 extending in the left-right direction. In a substrate contact region 110 located at the outside of the p-type MOSFET formation region 111, an impurity doped interconnect 100 is formed. The impurity doped interconnect 100 is connected to a first metal interconnect 102 through a contact hole 101. In a substrate contact region 210 located at the outside of the n-type MOSFET formation region 211, an impurity doped interconnect 200 is formed. The impurity doped interconnect 200 is connected to a first metal interconnect 202 through a contact hole 201.

Figure 21:
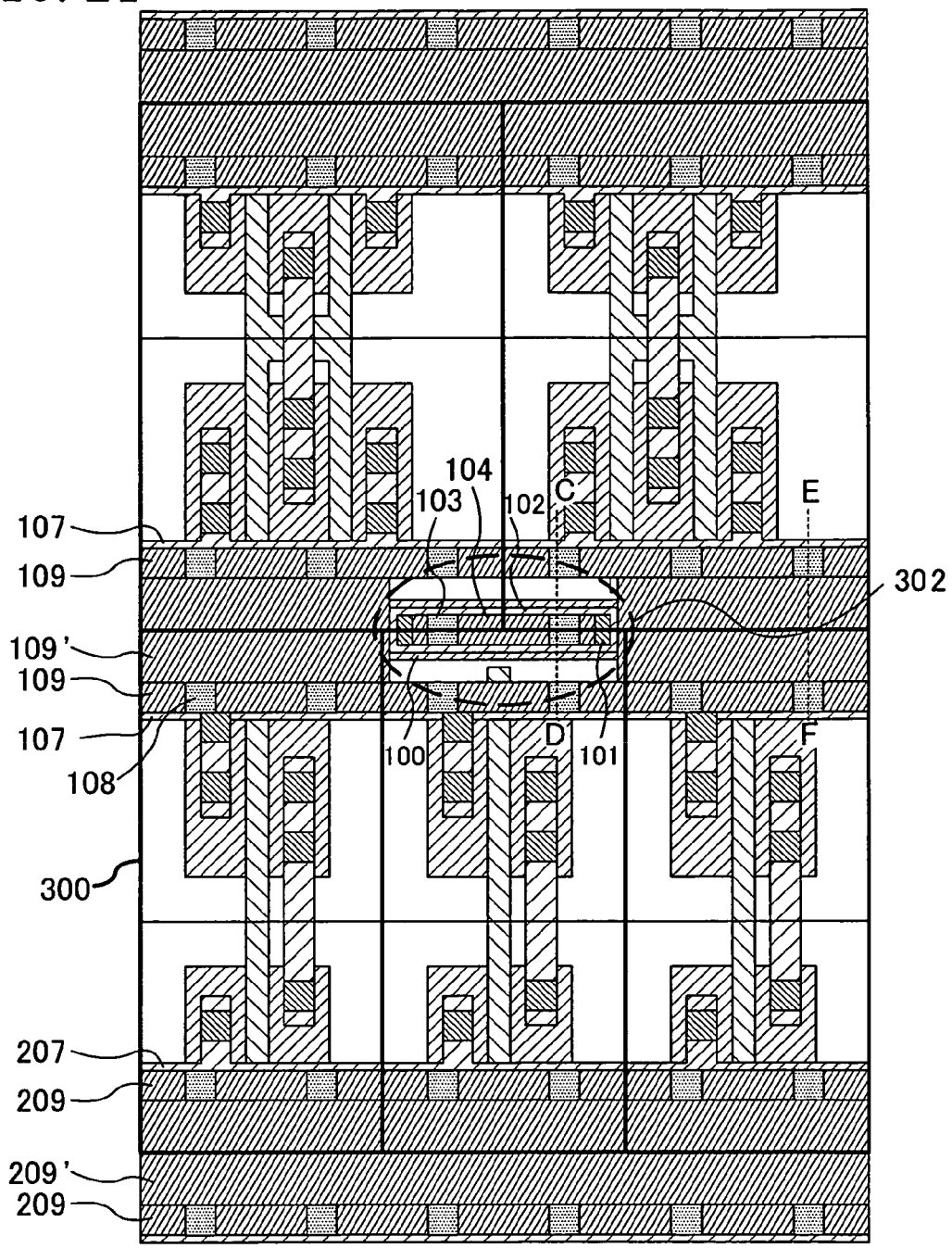
FIG. 21 is a plan view illustrating cell rows employing the standard cell of FIG. 19.
Figure 22:
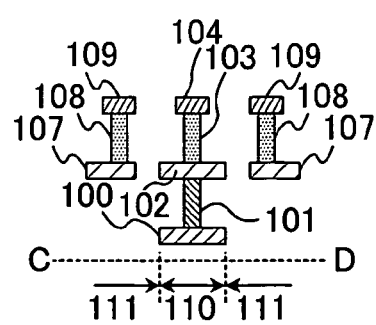
FIG. 22 is a cross-sectional view taken along the line C-D shown in FIG. 21.
Figure 23:
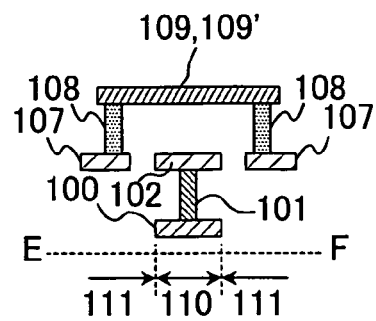
FIG. 23 is a cross-sectional view taken along the line E-F shown in FIG. 21.

FIG. 21 is a plan view illustrating cell rows employing the standard cell 300 of FIG. 19. FIG. 22 is a cross-sectional view taken along the line C-D shown in FIG. 21. FIG. 23 is a cross-sectional view taken along the line E-F shown in FIG. 21.

As shown in FIG. 21, a metal interconnect 109' (which is in contact with second metal interconnects 109 of adjacent cells in the up-down direction) for reinforcing the second metal interconnects 109 is formed in the same layer as the second metal interconnect 109 so as to be located over the first interconnect 102 between adjacent cell rows in the up-down direction. A rectangular opening for a substrate contact formation section 302 is formed by the second metal interconnects 109 and 109'. The second metal interconnects 109 and 109' receive a supply of VDD. In the same manner, a metal interconnect 209' (in contact with second metal interconnects 209 of adjacent cells in the up-down direction) for reinforcing the second metal interconnects 209 is formed in the same layer as the second metal interconnects 209. In the substrate contact formation section 302, a second metal interconnect 104 is formed over the first metal interconnect 102 to be connected to the second metal interconnect 104 through a via hole 103. The second metal interconnect 104 receives a supply of VDDBB. Thus, the amount of a voltage drop in a substrate potential supply line formed of the first metal interconnect 102 and the second metal interconnect 104 can be reduced and also the amount of a voltage drop in a power potential supply line formed of the first metal interconnects 107 and the second metal interconnects 109 and 109' can be reduced.

Tenth Embodiment

Figure 24:
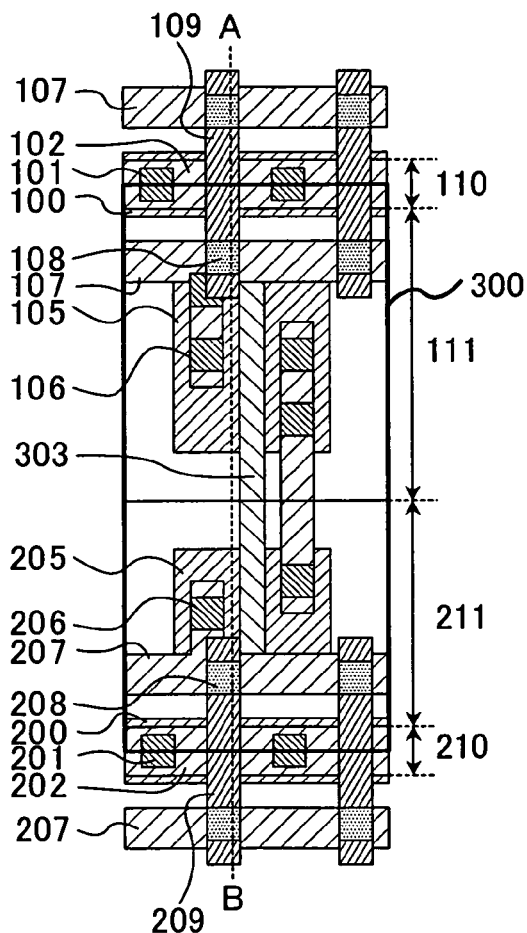
FIG. 24 is a plan view of a standard cell in a semiconductor device according to a tenth embodiment of the present invention.
Figure 25:
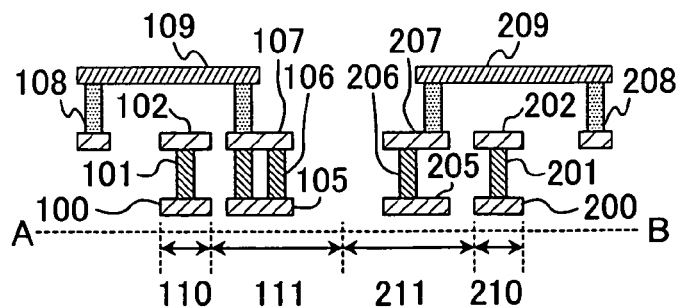
FIG. 25 is a cross-sectional view taken along the line A-B shown in FIG. 24.

FIG. 24 is a plan view of a standard cell 300 in a semiconductor device according to a tenth embodiment of the present invention. FIG. 25 is a cross-sectional view taken along the line A-B shown in FIG. 24.

In this embodiment, unlike the ninth embodiment, each of a second metal interconnect 109 for receiving a supply of VDD and a second metal interconnect 209 for receiving a supply of VSS extends in the up-down direction to reach adjacent cells thereto.

Figure 26:
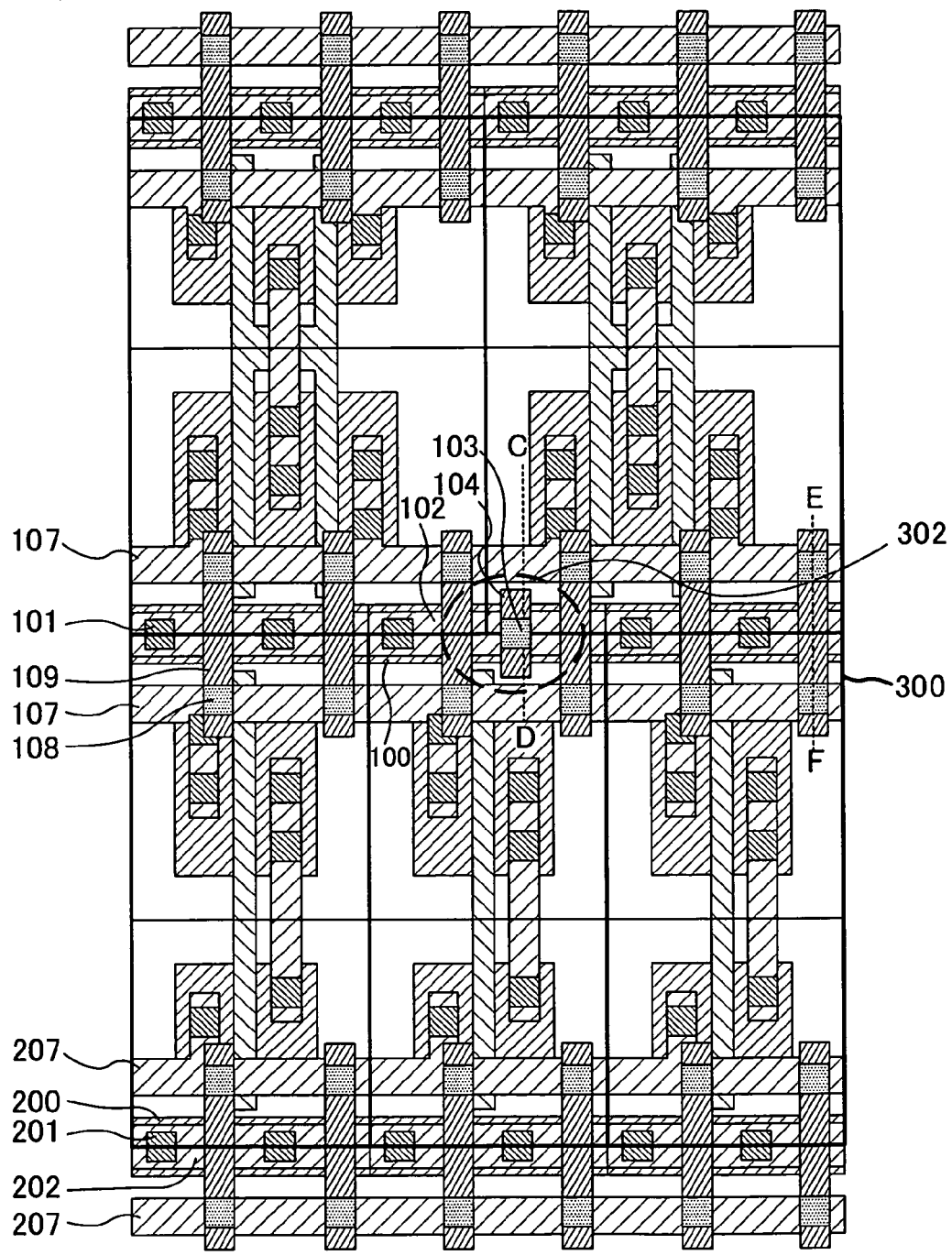
FIG. 26 is a plan view illustrating cell rows employing the standard cell of FIG. 24.
Figure 27:
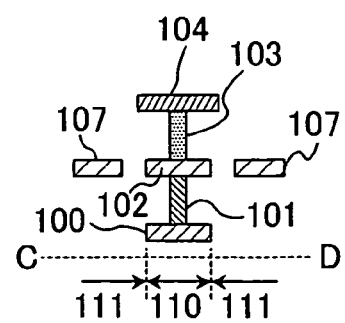
FIG. 27 is a cross-sectional view taken along the line C-D shown in FIG. 26.
Figure 28:
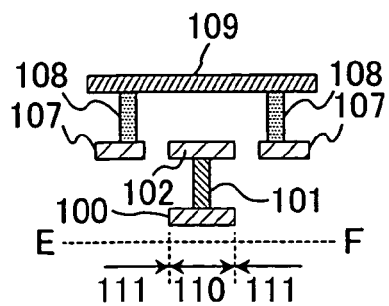
FIG. 28 is a cross-sectional view taken along the line E-F shown in FIG. 26.
Figure 29:
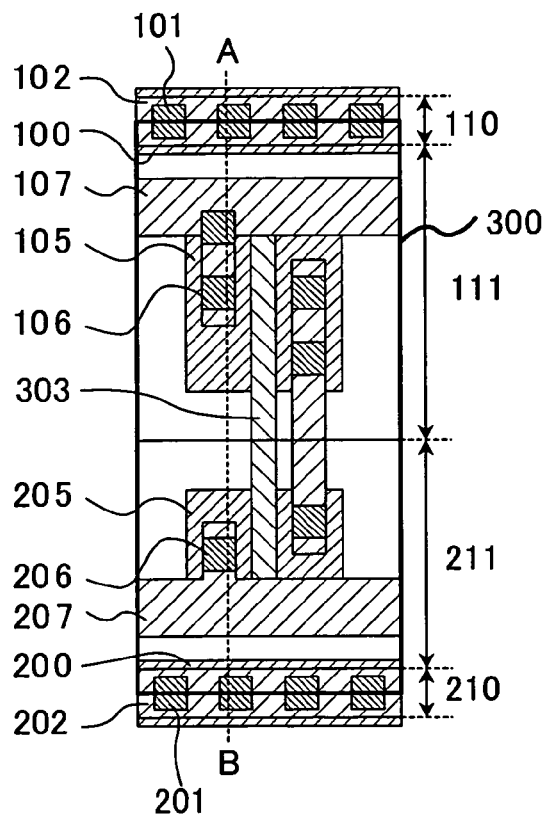
FIG. 29 is a plan view of a standard cell in a semiconductor device according to a first known technique.
Figure 30:
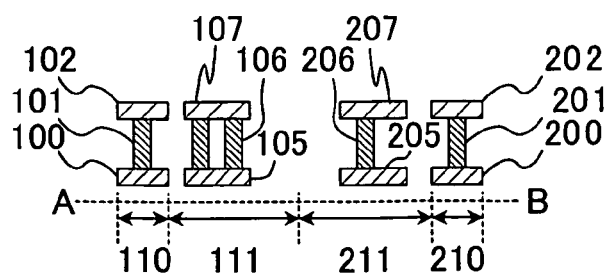
FIG. 30 is a cross-sectional view taken along the line A-B shown in FIG. 29.
Figure 31:
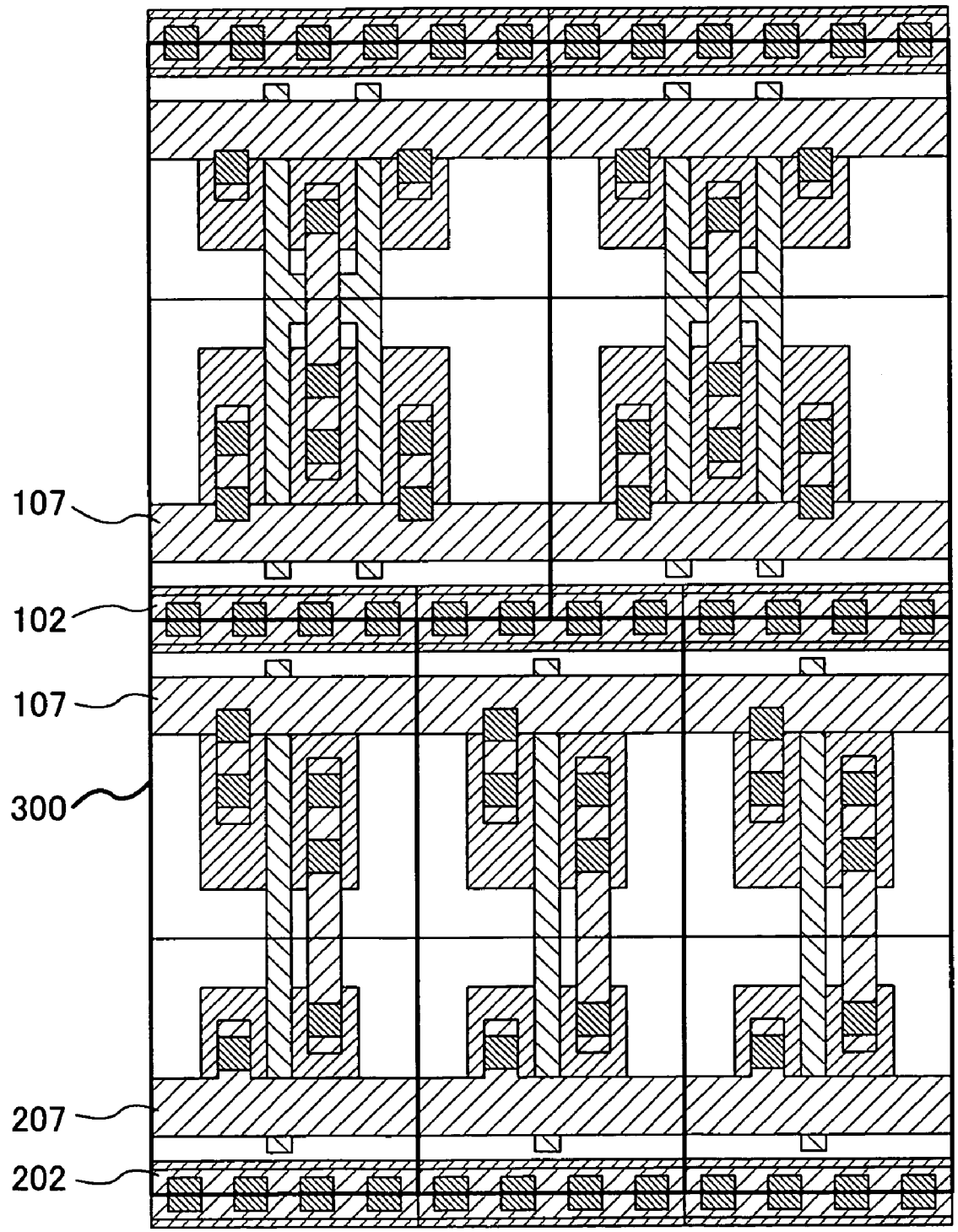
FIG. 31 is a plan view illustrating cell rows employing the standard cell of FIG. 29.
Figure 32:
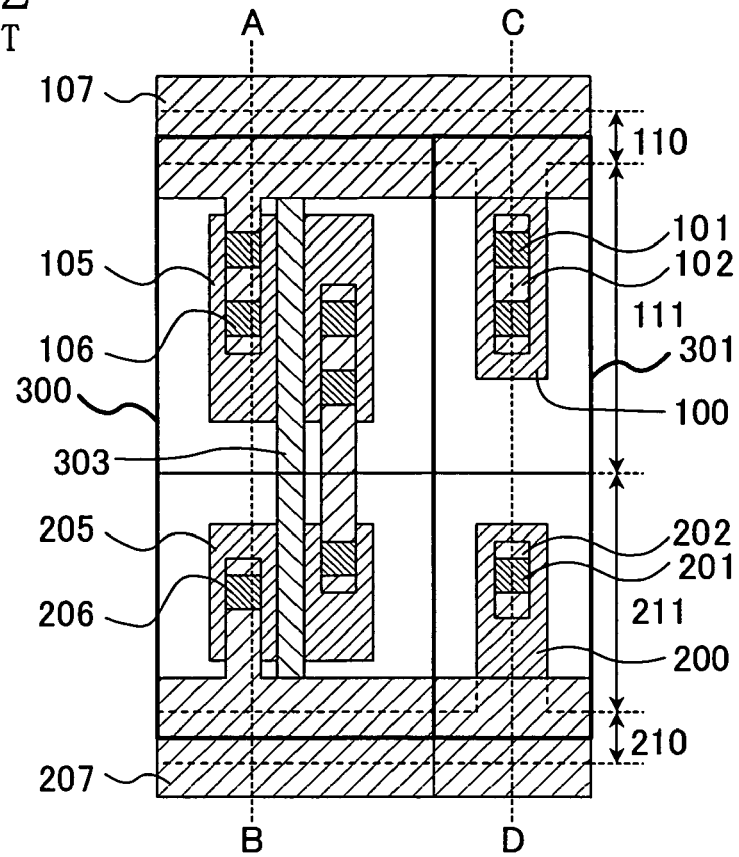
FIG. 32 is a plan view illustrating a standard cell and a substrate potential supply cell in a semiconductor device according to a second known technique.
Figure 33:
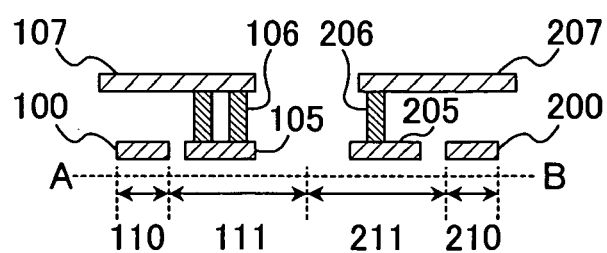
FIG. 33 is a cross-sectional view taken along the line A-B shown in FIG. 32.
Figure 34:
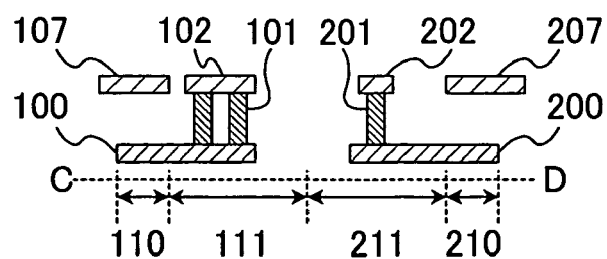
FIG. 34 is a cross-sectional view taken along the line C-D shown in FIG. 32.
Figure 35:
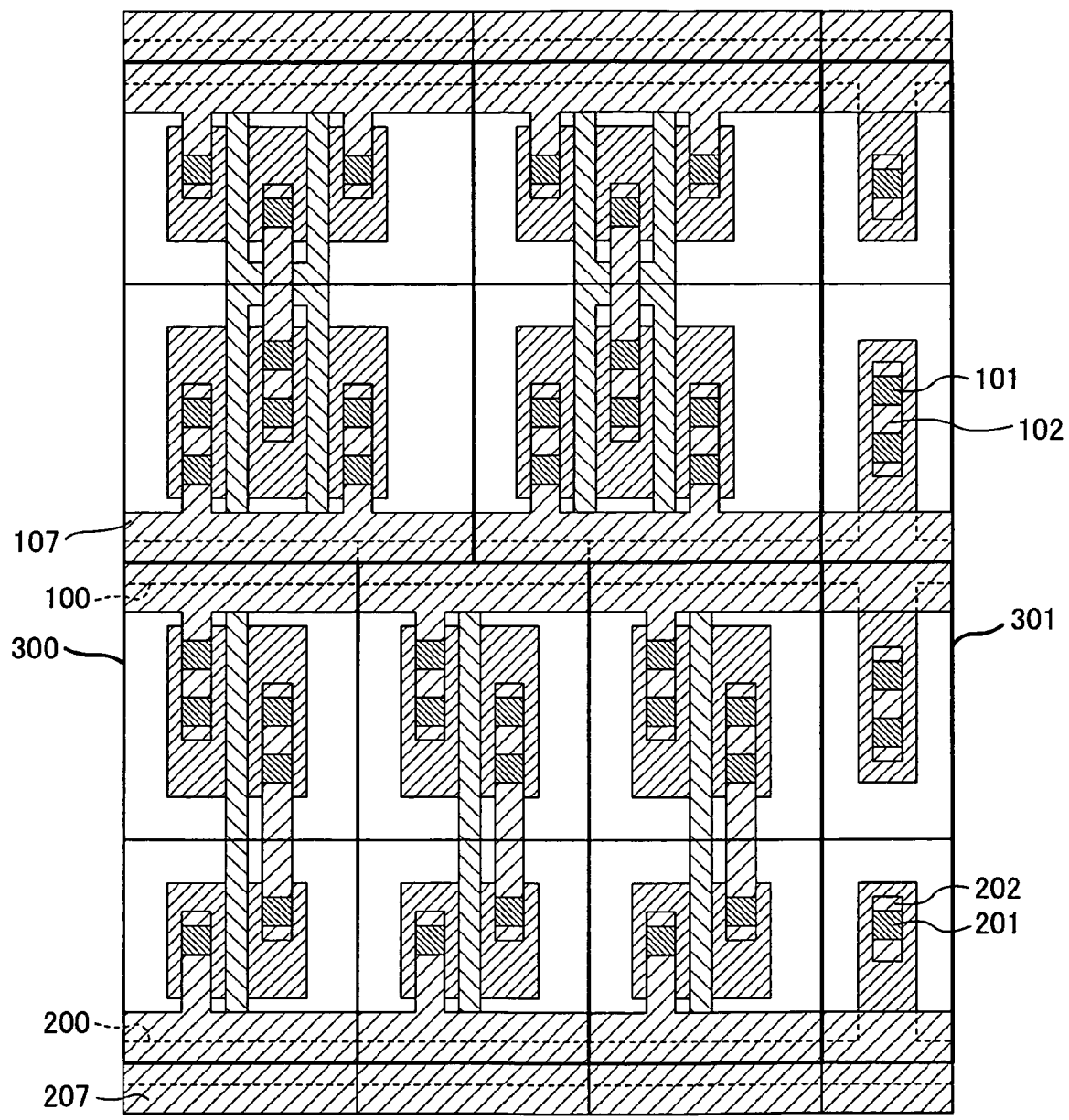
FIG. 35 is a plan view illustrating cell rows employing the standard cell and the substrate potential supply cell of FIG. 32.

FIG. 26 is a plan view illustrating cell rows employing the standard cell 300 of FIG. 24. FIG. 27 is a cross-sectional view taken along the line C-D of FIG. 26. FIG. 28 is a cross-sectional view taken along the line E-F shown in FIG. 26.

As shown in FIG. 26, a rectangular opening for a substrate contact formation section 302 is formed by a first metal interconnect 107 and a second metal interconnect 109. The first metal interconnect 107 and the second metal interconnect 109 intersect with each other at right angle to serve as a power supply potential supply line. In the substrate contact formation section 302, a second metal interconnect 104 is formed over a first metal interconnect 102 so that the second metal interconnect 104 is connected to the first metal interconnect 102 through a via hole 103 and the first metal interconnect 102 for receiving a supply of VDDBB is lined with the second metal interconnect 104. The second metal interconnect 104 also extends in the up-down direction to reach adjacent cells thereto. Thus, the amount of a voltage drop in a substrate potential supply line formed of the first metal interconnect 102 and the second metal interconnect 104 can be reduced and also the amount of a voltage drop in a power supply potential supply line formed of the first metal interconnect 107 and the second metal interconnect 109 can be reduced. Moreover, a layout structure can be made suitable for a layout design environment where the direction in which the second metal interconnects 104 and 109 extend is limited to the up-down direction.

The first through tenth embodiments of the present invention have been described above. However, the present invention is not limited to the above-described embodiments. For example, in each of the third through eighth embodiments, as in the first embodiment, first metal interconnects for receiving a supply of VDD may be separately formed in two parts, i.e., 107 and 107'. The present invention is applicable to formation of a well potential supply line for supplying a well potential to each standard cell 300, instead of formation of the substrate potential supply line.

As has been described, a standard cell according to the present invention and a semiconductor device employing the standard cell has a layout structure which allows separate supply of a substrate potential and a power supply potential to the standard cell. Accordingly, the inventive standard cell and semiconductor device not only are useful for reduction in power consumption of an LSI but also allow reduction in power supply interconnect region, and the amount of a voltage drop is reduced. Therefore, the standard cell and semiconductor device of the present invention are useful for reduction in size and increase in operation speed of LSIs.

What is claimed is:

1. A semiconductor device comprising:
    a plurality of cell rows each including a plurality of standard cells arranged therein;
    a first power supply line for supplying a first potential to each of the standard cells; and
    a second power supply line for supplying a second potential to each of the standard cells, the second power supply line being electrically separated from the first power supply line,
    wherein adjacent two of the standard cells in the cell rows or ones of the standard cells arranged in one of the cell rows share the first power supply line through a first interconnect provided in an interconnect layer and share the second power supply line through a second interconnect provided in the interconnect layer.

2. The semiconductor device of claim 1, wherein the first power supply line or the second power supply line is arranged in parallel to the cell rows.

3. The semiconductor device of claim 1, wherein the first power supply line or the second power supply line is formed by connecting ones of the standard cells located in adjacent two of the cell rows being connected at a cell boundary portion between the adjacent cell rows.

4. The semiconductor device of claim 1, wherein the first power supply line or the second power supply line is arranged in the vicinity of a boundary between adjacent two of the cell rows.

5. The semiconductor device of claim 1, wherein the first power supply line or the second power supply line is arranged so as to extend in the parallel direction to the cell rows.

6. The semiconductor device of claim 1, wherein the interconnect layer is a bottom layer of plural metal interconnect layers of the semiconductor device.

7. The semiconductor device of claim 1 wherein the interconnect layer is a metal interconnect layer other than a bottom layer of plural metal interconnect layers of the semiconductor device.

8. The semiconductor device of claim 1, wherein the first power supply line or the second power supply line is reinforced by a third power supply line which is arranged in parallel to the cell rows.

9. The semiconductor device of claim 1, wherein the first interconnect is surrounded on three or four sides by the second interconnect.

10. The semiconductor device of claim 1, wherein one of the first power supply line and the second power supply line is a power supply line for supplying a substrate potential or well potential of the standard cells and the other is a power supply line for supplying a power supply potential of the standard cells.

11. The semiconductor device of claim 1, wherein the first power supply line and the second power supply line are connected to a plurality of main power supply lines provided in an upper layer over the interconnect layer and arranged in the vertical direction to the cell rows with the first power supply line and the second power supply line electrically separated from each other.

12. A layout design method for the semiconductor device of claim 1, the method comprising the step of forming the first power supply line or the second power supply line after formation of the cell rows.

13. The semiconductor device of claim 1, wherein the first power supply line supplies a first power supply potential and the second power supply line supplies a well potential or a substrate potential.

14. The semiconductor device of claim 1, further comprising a third power supply line for supplying a second power supply potential different from the first power supply potential to at least one of the standard cells.

* * * * *